United States Patent
Park et al.

(12)

(10) Patent No.: US 7,332,740 B2
(45) Date of Patent: Feb. 19, 2008

(54) MEMORY DEVICE HAVING MOLECULAR ADSORPTION LAYER

(75) Inventors: Noe-jung Park, Suwon-si (KR);
Kwang-hee Kim, Seoul (KR);
Dong-hun Kang, Yongin-si (KR);
Jae-woong Hyun, Uijeongbu-si (KR);
Ki-ha Hong, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 115 days.

(21) Appl. No.: 11/221,864

(22) Filed: Sep. 9, 2005

(65) Prior Publication Data
US 2006/0091440 A1 May 4, 2006

(30) Foreign Application Priority Data
Nov. 3, 2004 (KR) ............ 10-2004-0088916

(51) Int. Cl.
*H01L 35/24* (2006.01)
*H01L 51/00* (2006.01)

(52) U.S. Cl. ............... 257/40; 257/288; 977/742

(58) Field of Classification Search .......... 257/40, 257/288; 977/742, 743, 748, 750
See application file for complete search history.

(56) References Cited

U.S. PATENT DOCUMENTS 7,015,500 B2 * 3/2006 Choi et al. ............... 257/40

7,247,877 B2 * 7/2007 Hakey et al. ............ 257/24
2003/0122133 A1 7/2003 Choi et al.

FOREIGN PATENT DOCUMENTS

KR 2003-0068029 8/2003

OTHER PUBLICATIONS

Yu-Ming Lin et al., "Ambipolar-to-Unipolar Conversion of Carbon Nanotube Transistors by Gate Structure Engineering", Nano Letters 2004, Vo. 4, No. 5, pp. 947-950.
Korean Office Action dated Apr. 26, 2006.

* cited by examiner

*Primary Examiner*—Theresa T Doan
(74) *Attorney, Agent, or Firm*—Buchanan Ingersoll & Rooney PC

(57) ABSTRACT

Provided is a memory device comprising a molecular adsorption layer. The memory device includes: a substrate; a source electrode and a drain electrode formed on the substrate and separated from each other; a carbon nanotube (CNT) layer electrically connected to the source electrode and the drain electrode; a memory cell contacting the CNT so as to store a charge from the CNT; and a gate electrode formed on the memory cell, wherein the memory cell comprises: a first insulating layer formed on the CNT; a molecular adsorption layer which is formed on the first insulating layer and acts as a charge storage layer; and a second insulating layer formed on the molecular adsorption layer.

19 Claims, 7 Drawing Sheets

MEMORY DEVICE HAVING MOLECULAR ADSORPTION LAYER

BACKGROUND OF THE INVENTION

This application claims the benefit of Korean Patent Application No. 10-2004-0088916, filed on Nov. 3, 2004, in the Korean Intellectual Property Office, the disclosure of which is incorporated herein in its entirety by reference.

1. Field of the Disclosure

The present disclosure relates to a non-volatile memory device using carbon nanotubes (CNTs) as charge transport channels and comprising a memory cell having a molecular adsorption layer.

2. Description of the Related Art

A memory device includes a memory cell for writing and reading information and a transistor for switching an electrical current flow during writing and reading of the information in the memory cell.

CNTs have excellent electrical conductivity and thermal stability and may have a long length of the order of micrometers with a diameter ranging from several nanometers to several tens of nanometers. CNTs may be applied to nano electro mechanical system (NEMS) devices having microstructures. Extensive research has been conducted on the use of CNTs in various devices and they are now used in electric field emission devices, optical switches in the field of optical communication, biodevices, etc.

Methods of manufacturing CNTs are well known in the art. Examples include arc discharge, pulsed laser vaporization, chemical vapor deposition, screen printing, spin coating.

To use CNTs in a memory device, p-type and n-type transistors are required. However, conventional transistors using CNTs exhibit ambipolar properties in a specific atmosphere or vacuum. Such transistors having ambipolar properties cannot be used as electronic devices.

A method of converting an ambipolar carbon nanotube field effect transistor (CNT FET) into a unipolar CNT FET is described in NANO LETTERS, 2004 Vol. 4, No. 5, PP 947-950. In this method, a gate oxide layer on a drain electrode side was etched and a portion of a silicon substrate below the etched region was "V" cut to realize a p-type CNT FET. However, the process of obtaining the unipolar CNT FET is very complex.

Thus, there is a need to readily produce a p-type transistor using a CNT as a channel region.

SUMMARY OF THE DISCLOSURE

The present disclosure provides a memory device comprising a memory cell using a molecular adsorption layer as a charge storage layer, the molecular adsorption layer comprising an adsorbed molecular layer having an energy level within an energy band gap of a carbon nanotube (CNT).

According to an aspect of the present disclosure, there is provided a memory device including: a substrate; a source electrode and a drain electrode formed on the substrate and separated from each other; a carbon nanotube (CNT) electrically connected to the source electrode and the drain electrode; a memory cell contacting the CNT so as to store a charge from the CNT; and a gate electrode formed on the memory cell, wherein the memory cell includes: a first insulating layer formed on the CNT; a molecular adsorption layer which is formed on the first insulating layer and acts as a charge storage layer; and a second insulating layer formed on the molecular adsorption layer.

According to another aspect of the present disclosure, there is provided a memory device including: a conductive substrate; a memory cell formed on the conductive substrate; a source electrode and a drain electrode formed on the memory cell and separated from each other; a CNT formed on the memory cell and electrically connected to the source electrode and the drain electrode; wherein the memory cell includes: a first insulating layer formed on the substrate; a molecular adsorption layer which is formed on the first insulating layer and acts as a charge storage layer; and a second insulating layer formed on the molecular adsorption layer.

According to yet another yet another aspect of the present disclosure, there is provided a memory device including: a substrate; a first insulating layer formed on the substrate; a source electrode and a drain electrode formed on the first insulating layer and separated from each other; a CNT electrically connected to the source electrode and the drain electrode; a gate electrode formed on the first insulating layer between the source electrode and the drain electrode and separated from the CNT; a molecular adsorption layer which is formed on the CNT and the first insulating layer and acts as a charge storage layer; and a second insulating layer formed on the molecular adsorption layer, wherein the first insulating layer, the molecular adsorption layer, and the second Insulating layer composes a memory cell.

The molecular adsorption layer may include a molecular layer having an energy level within an energy band gap of the CNT.

The molecular layer may be one selected from the group consisting of oxygen, bromine, iodine, and TTF (tetrathiafulvalene).

The molecular adsorption layer may include a base layer selected from the group consisting of amorphous carbon, CNT, boron nitride, and zeolite and the molecular layer may be adsorbed on the base layer.

The first and second insulating layers may be made of PMMA or an oxide.

The first and second insulating layers may be made of a high dielectric material.

The CNT may have a surface doped with alkali metal.

BRIEF DESCRIPTION OF THE DRAWINGS

The above and other features and advantages of the present disclosure will be further described in exemplary embodiments with reference to the attached drawings in which.

DESCRIPTION OF PREFERRED EMBODIMENTS

Hereinafter, a representative memory device comprising a molecular adsorption layer according to embodiments of the present disclosure will be described in detail with reference to the attached drawings.

Figure 1:
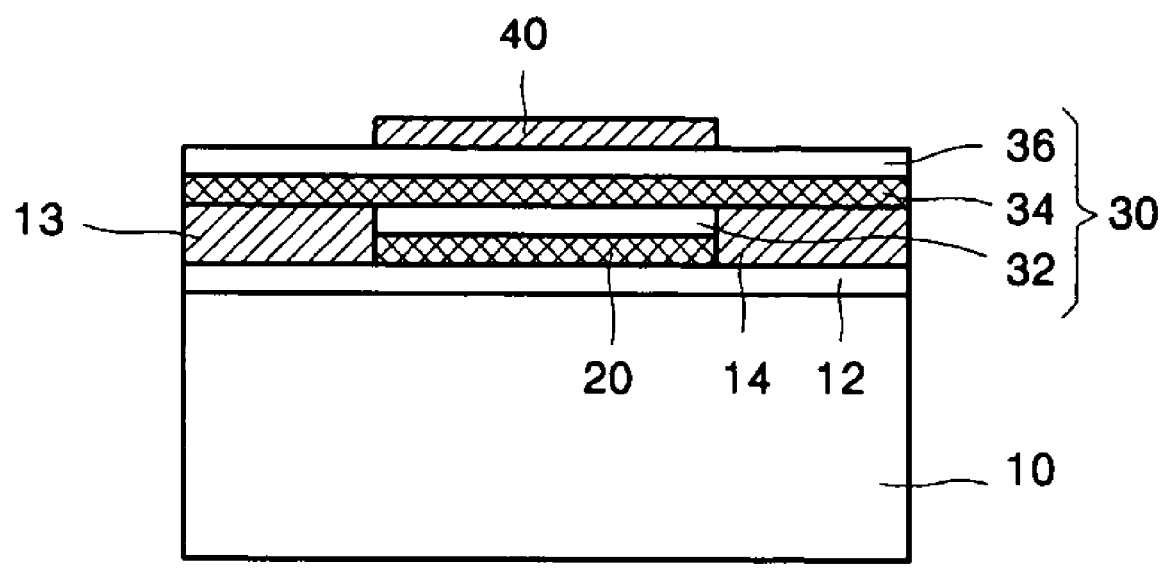
FIG. 1 is a cross-sectional view of a memory device comprising a molecular adsorption layer according to an embodiment of the present disclosure.

FIG. 1 is a cross-sectional view of a representative memory device comprising a molecular adsorption layer according to an embodiment of the present disclosure.

Referring to FIG. 1, an insulating layer 12, for example, made of silicon oxide is formed on a conductive substrate 10, for example, a highly doped silicon wafer. Electrodes 13 and 14 are formed on the insulating layer 12 and are separated from each other. A carbon nanotube (CNT) 20 is formed between the electrodes 13 and 14 and electrically connected to the electrodes 13 and 14. The electrodes 13 and 14 function as a drain region and a source region, respectively, and the CNT 20 which has a semiconductor property functions as a channel region.

A memory cell 30 is formed on the CNT 20 and a gate electrode 40 is formed on the memory cell 30. The memory cell 30 is composed of a first insulating layer 32, a second insulating layer 36, and a charge storage layer 34. The charge storage layer 34 stores charges, i.e., electrons and holes, and is interposed between the first insulating layer 32 and the second insulating layer 36. The gate electrode 40 controls transportation of the charges from the CNT 20 to the charge storage layer 34.

The charge storage layer 34 may be also referred to as a charge trap site. The charge storage layer 34 has a structure in which a molecular layer made of a material selected from oxygen, bromine, iodine, and tetrathiafulvalene (TTF) is adsorbed on a porous material, for example, amorphous carbon, CNT, boron nitride, and zeolite.

The first and second insulating layers 32 and 36 may be made of silicon oxide or polymethyl methacrylate (PMMA) and have a thickness ranging from several nanometers to several tens of nanometers.

Alternatively, the first and second insulating layers 32 and 36 may be made of a high dielectric material, such as $ZrO_2$ and $HfO_2$ in order to increase gate coupling.

The CNT 20 may be made of single-wall CNTs or double-wall CNTs.

Figure 2:
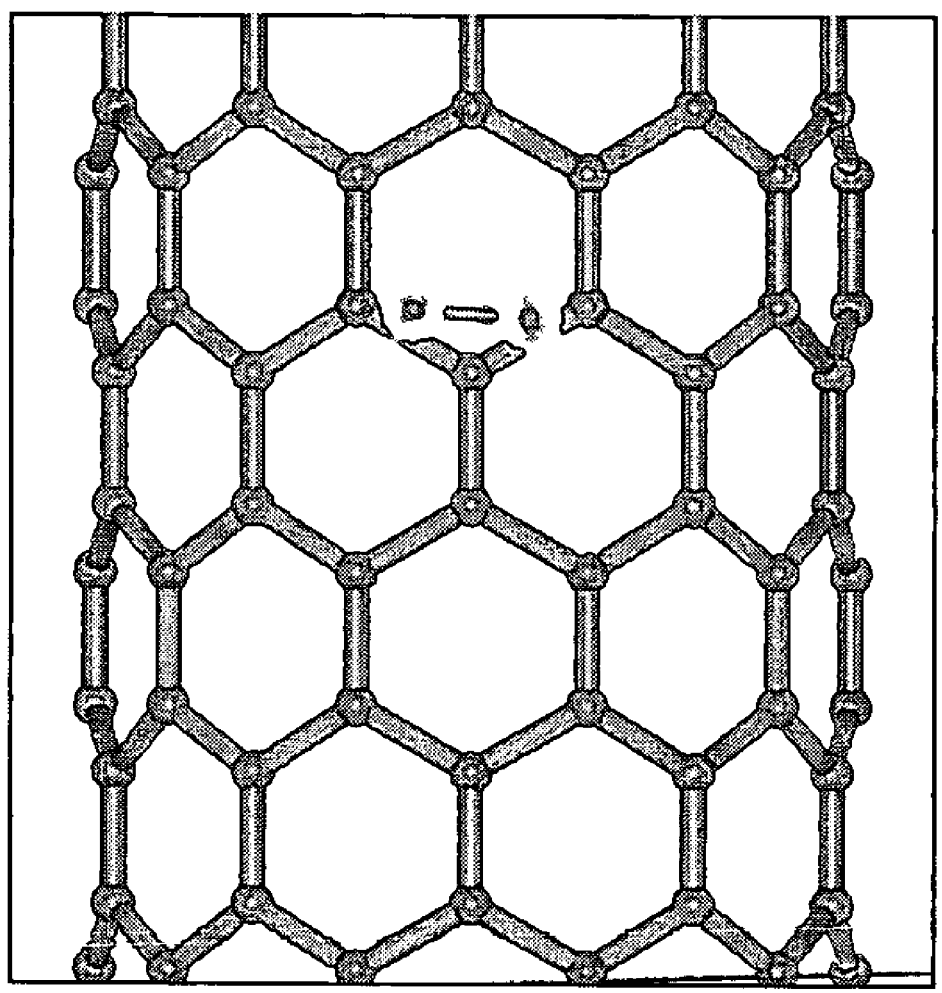
FIG. 2 is a model view illustrating an oxygen molecule adsorbed on carbon nanotubes (CNTs)

FIG. 2 is a model view illustrating an oxygen molecule adsorbed on CNTs.

Referring to FIG. 2, the oxygen molecule is adsorbed apart by 3.3Å from a surface of the CNTs. In this case, a binding energy of the oxygen to the CNT wall is 0.1 eV and the oxygen molecule is adsorbed on the CNT wall with a weak binding energy.

Figure 3:
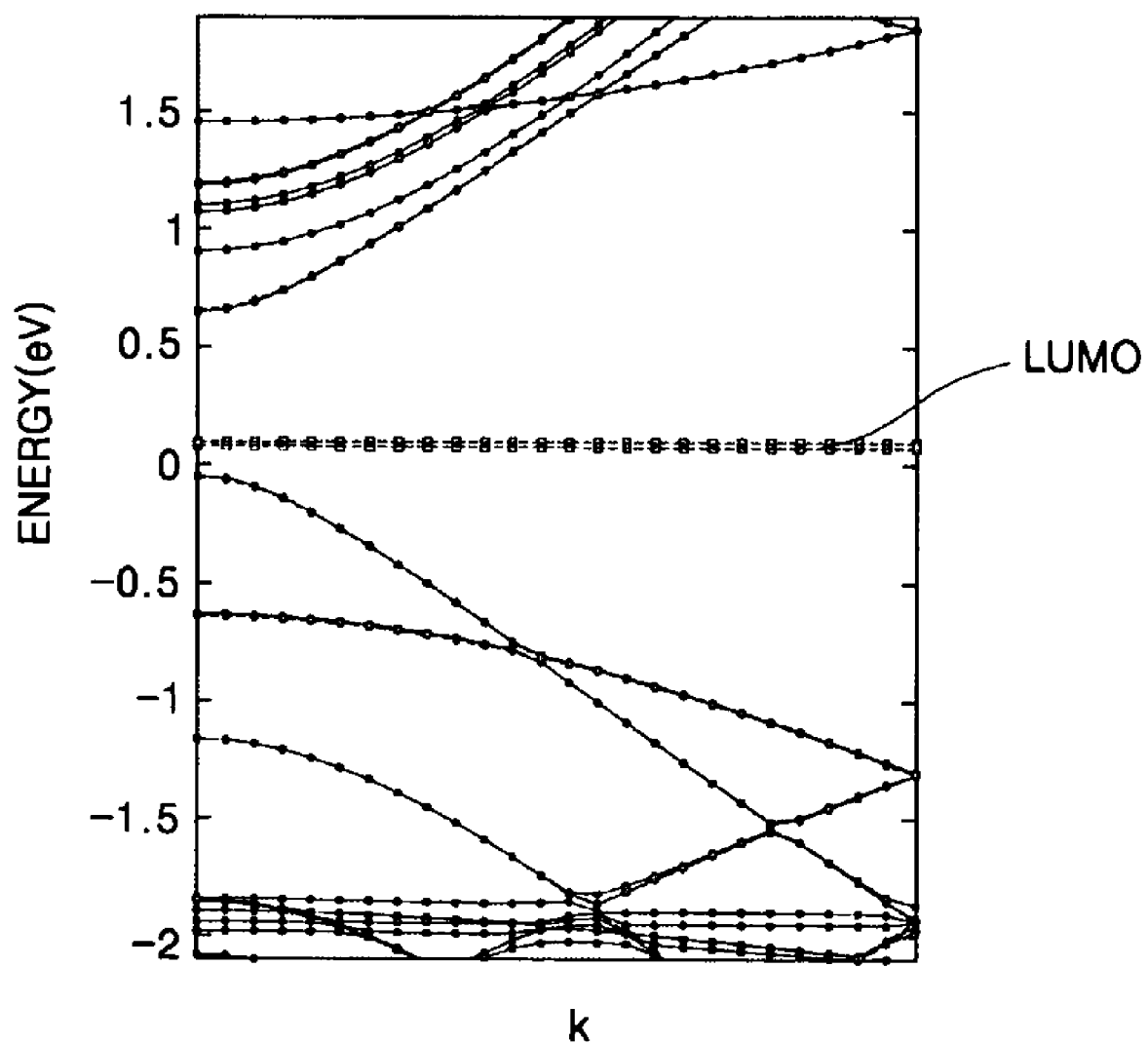
FIG. 3 is a graph showing results calculated using Ab initio program for a structure of a CNT layer having an oxygen molecule adsorbed thereon.

FIG. 3 is a graph showing results calculated using Ab initio program for a structure of the CNT 20 having an oxygen molecule adsorbed thereon.

Referring to FIG. 3, a LUMO (lowest unoccupied molecular orbital) potential of the oxygen molecule is present between a valence band and a conducting band. Due to the LUMO of the oxygen molecule, a unipolar property described below is attained.

The molecular layer made of oxygen which provides the unipolar property has an energy level within an energy band gap of the CNT. A molecular layer made of bromine, iodine, or tetrathiafulvalene (TTF) may also have the same function as the molecular layer made of oxygen.

FIG. 1 is a cross-sectional view of a representative memory device comprising a molecular adsorption layer according to an embodiment of the present disclosure.

Figure 4:
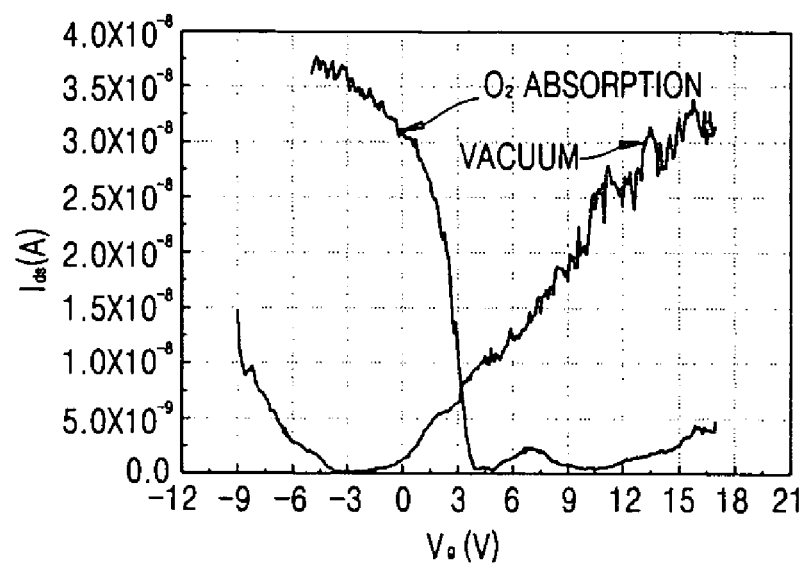
FIG. 4 is a graph showing operational properties of a memory device according to an embodiment of the present disclosure and a memory device in vacuum.

Referring to FIG. 4, a memory device before adsorption of oxygen molecules, i.e., in vacuum, exhibits p-type characteristics, i.e., when a gate bias voltage $V_g$ is applied in the negative direction, the transistor is turned on, and the memory device also exhibits n-type characteristics, i.e., when a gate bias voltage $V_g$ is applied in the positive direction, the transistor is turned on. That is, the memory device exhibits ambipolar properties.

The memory device according to the present embodiment, which has a molecular layer of oxygen, exhibits p-type characteristics, i.e., when a gate bias voltage $V_g$ is applied in the negative direction, the transistor is turned on. Meanwhile, when a gate voltage $V_g$ is applied in the positive direction, the transistor is not turned on. That is, the oxygen molecules adsorbed on the CNT prevents opening of an n-type channel. Thus, the memory device exhibits unipolar properties.

Figure 5:
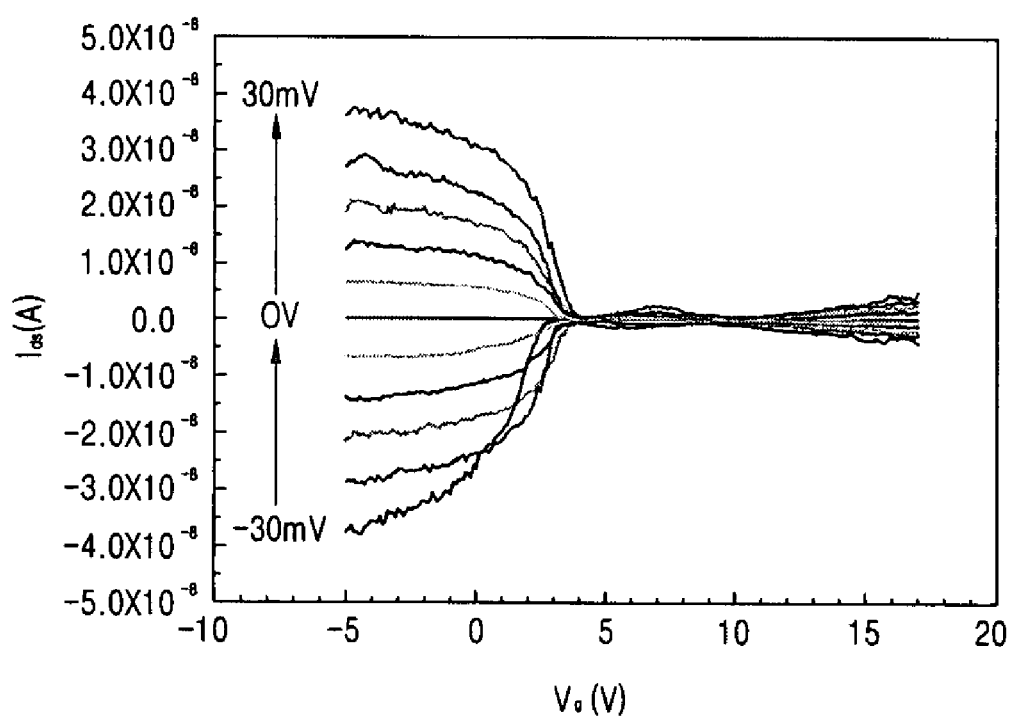
FIG. 5 is a graph showing p-type characteristics of a memory device according to an embodiment of the present disclosure.

FIG. 5 is a graph showing p-type characteristics of a memory device according to an embodiment of the present invention. Referring to FIG. 5, a change of a channel current $I_{ds}$ which occurs while changing source/drain voltages applied to a memory cell manufactured using double-wall CNTs according to an embodiment of the present disclosure from −30 mV to 30 mV demonstrates that the memory device has p-type characteristics.

It is interpreted that the memory device has the unipolar property since when the gate voltage is applied in the positive direction, a partially occupied LUMO of the oxygen molecule between the valence band and the conducting band is prevented from going down, that is, opening of an n-channel is prevented.

Figure 6:
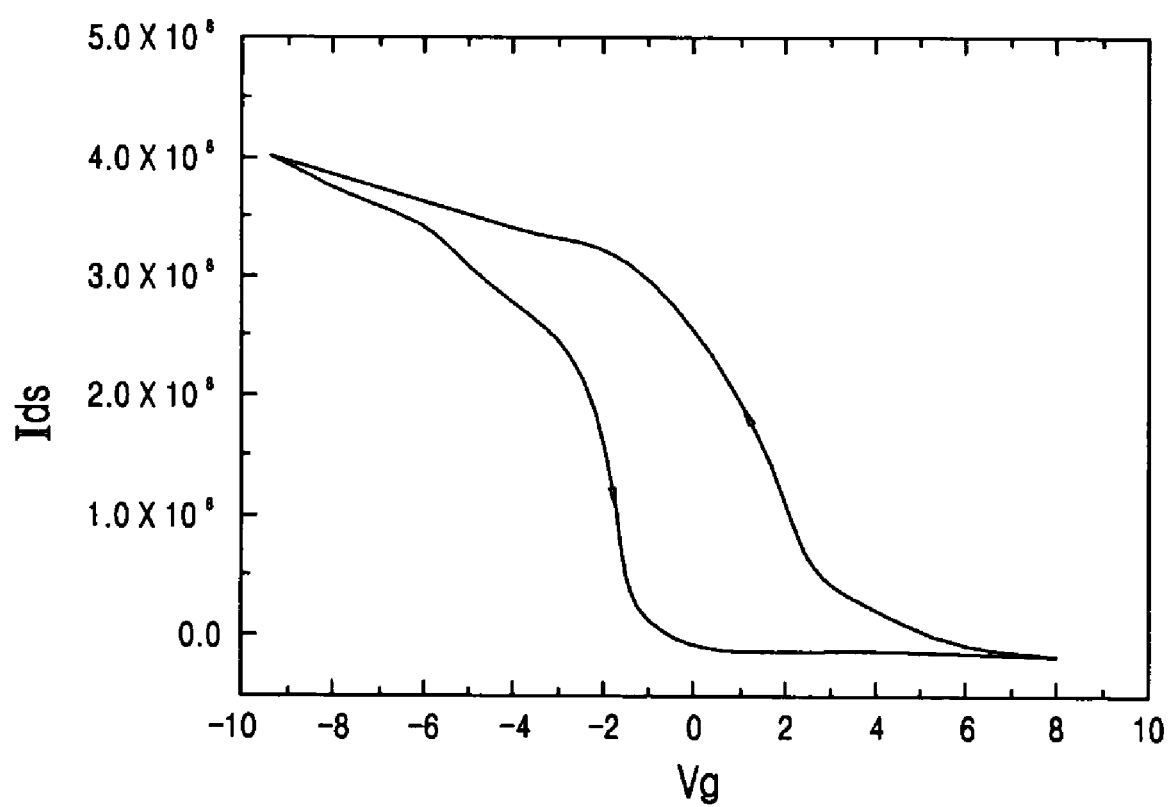
FIG. 6 is a I-V graph of the memory device illustrated in FIG. 1.

FIG. 6 is a I-V graph of the memory device illustrated in FIG. 1.

Referring to FIG. 6, when a predetermined voltage is applied to the electrodes 13 and 14 and a positive gate voltage $V_g$ is applied to the gate electrode 40, the charge is trapped in the charge storage layer 34. In such a state, it is regarded that first data is written on the memory cell 30. The first data may be "0" or "1".

When a negative gate voltage $V_g$ is applied to the gate electrode 40, the charge in the memory cell 30 is discharged. In such a state, it is regarded that second data is written on the memory cell 30. The second data may be "1" or "0".

When a voltage is applied to the electrodes 13 and 14 and a current $I_{ds}$ flowing through the CNT 20 is a predetermined value or more, it is regarded that the first data is read from the memory cell 30 and when a current $I_{ds}$ flowing through the CNT 20 is the predetermined value or less, it is regarded that the second data is read from the memory cell 30.

Although a p-type memory device was explained in the present embodiment, the present disclosure is not limited thereto. When the CNT 20 is doped with alkali metal, for example, potassium, the memory device has n-type characteristics (see U.S. patent application No. 2003/0122133).

A writing operation of the memory device having the n-type CNTs is the same as described above. In a reading operation, a current $I_{ds}$ flowing through the CNT 20 when a predetermined gate voltage is applied to the gate electrode 40 is read.

Figure 7:
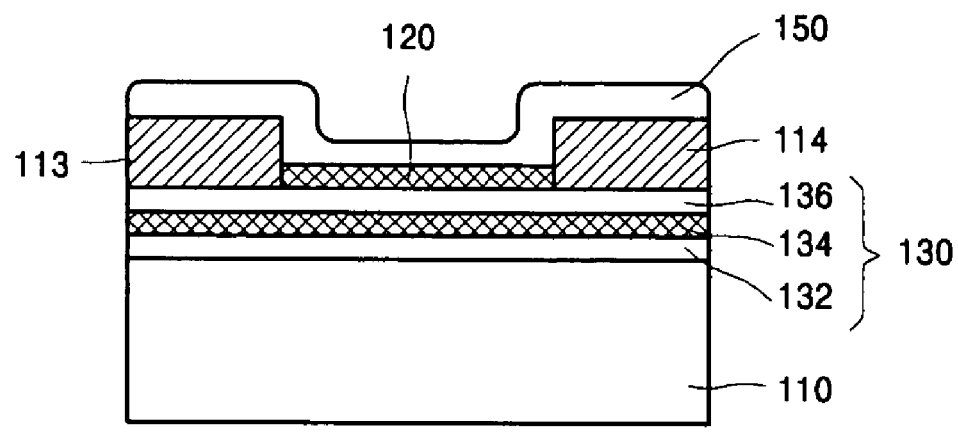
FIG. 7 is a cross-sectional view of a memory device according to another embodiment of the present disclosure.

FIG. 7 is a cross-sectional view of a memory device according to another embodiment of the present disclosure.

Referring to FIG. 7, a memory cell 130 is formed on a conductive substrate 110, for example, a highly doped silicon wafer. Electrodes 113 and 114 are formed on the memory cell 130 and are separated from each other. A CNT 120 is formed between the electrodes 113 and 114 and electrically connected to the electrodes 113 and 114. The electrodes 113 and 114 function as a drain region and a source region, respectively, and the CNT 120 which has a semiconductor property functions as a channel region. Reference numeral 150 denotes a passivation layer.

The memory cell 130 is composed of a first insulating layer 132, a second insulating layer 136, and a charge storage layer 134. The charge storage layer 134 stores charges, i.e., electrons and holes, and is interposed between the first insulating layer 132 and the second insulating layer 136. The conductive substrate 110 functions as a gate electrode and controls transportation of the charges from the CNT 120 to the charge storage layer 134.

The charge storage layer 134 may be also referred to as a charge trap site. The charge storage layer 134 has a structure in which a molecular layer made of a material selected from oxygen, bromine, iodine, and TTF (tetrathiafulvalene) is adsorbed on a porous material, for example, amorphous carbon, CNT, boron nitride, and zeolite.

The first and second insulating layers 132 and 136 may be made of silicon oxide or PMMA and have a thickness ranging from several nanometers to several tens of nanometers.

Alternatively, the first and second insulating layers 132 and 136 may be made of a high dielectric material, such as $ZrO_2$ and $HfO_2$ in order to increase gate coupling.

The CNT 120 may be made of single-wall CNTs or double-wall CNTs.

Since operations of the memory device illustrated in FIG. 7 are substantially identical to those of the memory device illustrated in FIG. 1, detailed descriptions thereof will not be repeated.

Figure 8:
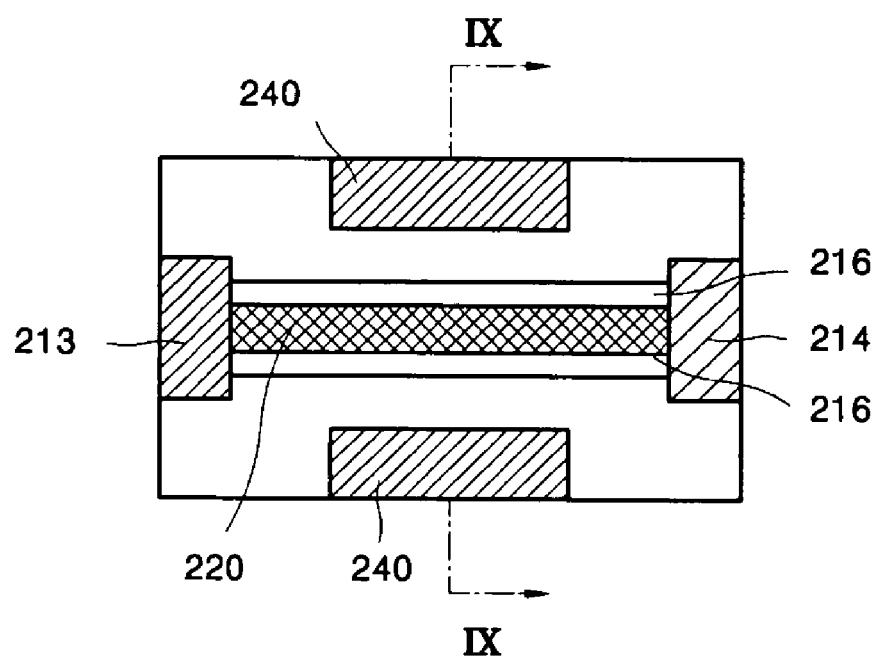
FIG. 8 is a top view of a memory device according to still another embodiment of the present disclosure.
Figure 9:
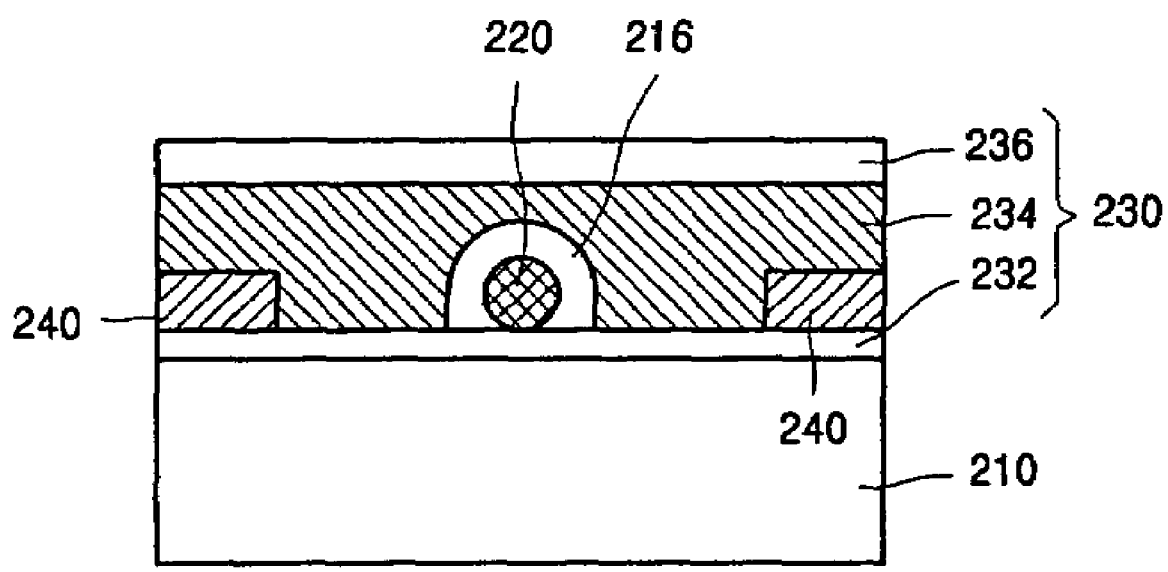
FIG. 9 is a cross-sectional view taken along line IX-IX of the memory device illustrated in FIG. 8.

FIG. 8 is a top view of a memory device according to still another embodiment of the present disclosure. FIG. 9 is a cross-sectional view taken along line IX-IX of the memory device illustrated in FIG. 8.

Referring to FIGS. 8 and 9, a first insulating layer 232 is formed on a conductive substrate 210. Electrodes 213 and 214 are formed on the first insulating layer 232 and are separated from each other. A CNT 220 is formed between the electrodes 213 and 214 and electrically connected to the electrodes 213 and 214. The electrodes 213 and 214 function as a drain region and a source region, respectively, and the CNT 220 which has a semiconductor property functions as a channel region. A gate electrode 240 is formed on the first insulating layer 232 and isolated from each side of the CNT 220. A third insulating layer 216 is formed surrounding the CNT 220. A charge storage layer 234 is formed on the first insulating layer 232, the gate electrode 240, and a second insulating layer 236 is formed on the charge storage layer 234.

A memory cell 230 is composed of the first insulating layer 232, the second insulating layer 236, and the charge storage layer 234. The charge storage layer 234 stores charges, i.e., electrons and holes, and is interposed between the first insulating layer 232 and the second insulating layer 236.

The gate electrode 240 may be formed only one side of the CNT 220. The gate electrode 240 controls transportation of the charges from the CNT 220 to the charge storage layer 234.

The charge storage layer 234 may be also referred to as a charge trap site. The charge storage layer 234 has a structure in which a molecular layer made of a material selected from oxygen, bromine, iodine, and TTF (tetrathiafulvalene) is adsorbed on a porous material, for example, amorphous carbon, CNT, boron nitride, and zeolite.

The first and second insulating layers 232 and 236 may be made of silicon oxide or PMMA and have a thickness ranging from several nanometers to several tens of nanometers.

Alternatively, the first and second insulating layers 232 and 236 may be made of a high dielectric material, such as $ZrO_2$ and $HfO_2$ in order to increase gate coupling.

Since operations of the memory device illustrated in FIG. 8 are substantially identical to those of the memory device illustrated in FIG. 1, detailed descriptions thereof will not be repeated.

According to the present disclosure, by using as a memory region a charge storage layer in which a molecular layer having an energy level within an energy band gap of a CNT, which is used as a channel, is adsorbed on a porous material layer, for example, made of CNTs, a nano-scale non-volatile memory device can be obtained. Further, the charge storage layer can be applied to a memory device having a stable charge trap site.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A memory device comprising:
   a substrate;
   a source electrode and a drain electrode formed on the substrate and separated from each other;
   a carbon nanotube (CNT) electrically connected to the source electrode and the drain electrode;
   a memory cell contacting the CNT so as to store a charge from the CNT; and
   a gate electrode formed on the memory cell,
   wherein the memory cell comprises:
   a first insulating layer formed on the CNT;
   a charge storage layer which is formed on the first insulating layer, which stores charges and includes molecular adsorption layer of molecules having an energy level within an energy band gap of the CNT; and
   a second insulating layer formed on the molecular adsorption layer.

2. The memory device of claim 1, wherein the molecular layer is one selected from the group consisting of oxygen, bromine, iodine, and tetrathiafulvalene (TTF).

3. The memory device of claim 1, wherein the molecular adsorption layer comprises a base layer selected from the group consisting of amorphous carbon, CNT, boron nitride, and zeolite and the molecular layer is adsorbed on the base layer.

4. The memory device of claim 1, wherein the first and second insulating layers are made of polymethyl methacrylate (PMMA) or an oxide.

5. The memory device of claim 1, wherein the first and second insulating layers are made of a high dielectric material.

6. A memory device comprising:
   a substrate;
   a source electrode and a drain electrode formed on the substrate and separated from each other;

a carbon nanotube (CNT) electrically connected to the source electrode and the drain electrode;
a memory cell contacting the CNT so as to store a charge from the CNT; and
a gate electrode formed on the memory cell,
wherein the memory cell comprises:
a first insulating layer formed on the CNT;
a charge storage layer which is formed on the first insulating layer which stores charges; and
a second insulating layer formed on the charge storage layer
wherein the CNT has a surface doped with alkali metal.

7. A memory device comprising:
a conductive substrate;
a memory cell formed on the conductive substrate;
a source electrode and a drain electrode formed on the memory cell and separated from each other;
a CNT formed on the memory cell and electrically connected to the source electrode and the drain electrode;
wherein the memory cell comprises:
a first insulating layer formed on the substrate;
a charge storage layer which is formed on the first insulating layer and stores charges, and includes a molecular adsorption layer of molecules having an energy level within an energy band gap of the CNT; and
a second insulating layer formed on the molecular adsorption layer.

8. The memory device of claim 7, wherein the molecular adsorption layer is one selected from the group consisting of oxygen, bromine, iodine, and TTF (tetrathiafulvalene).

9. The memory device of claim 7, wherein the molecular adsorption layer comprises a base layer selected from the group consisting of amorphous carbon, CNT, boron nitride, and zeolite and the molecular layer is adsorbed on the base layer.

10. The memory device of claim 7, wherein the first and second insulating layers are made of PMMA or an oxide.

11. The memory device of claim 7, wherein the first and second insulating layers are made of a high dielectric material.

12. A memory device comprising:
a conductive substrate;
a memory cell formed on the conductive substrate;
a source electrode and a drain electrode formed on the memory cell and separated from each other;
a CNT formed on the memory cell and electrically connected to the source electrode and the drain electrode;
wherein the memory cell comprises:
a first insulating layer formed on the substrate;
a charge storage layer which is formed on the first insulating layer and stores charges; and
a second insulating layer formed on the charge storage layer,
wherein the CNT has a surface doped with alkali metal.

13. A memory device comprising:
a substrate;
a first insulating layer formed on the substrate;
a source electrode and a drain electrode formed on the first insulating layer and separated from each other;
a CNT electrically connected to the source electrode and the drain electrode;
a gate electrode formed on the first insulating layer between the source electrode and the drain electrode and separated from the CNT;
a charge storage layer which is formed on the CNT and the first insulating layer, which stores charges;
a second insulating layer formed on the charge storage layer; and
a third insulating layer interposed between the CNT and the charge storage layer to surround the CNT,
wherein the first insulating layer, the charge storage layer, the second insulating layer and the third insulating layer comprises a memory cell.

14. The memory device of claim 13, wherein the first and second insulating layers are made of PMMA or an oxide.

15. The memory device of claim 13, wherein the first and second insulating layers are made of a high dielectric material.

16. A memory device comprising:
a substrate;
a first insulating layer formed on the substrate;
a source electrode and a drain electrode formed on the first insulating layer and separated from each other;
a CNT electrically connected to the source electrode and the drain electrode;
a gate electrode formed on the first insulating layer between the source electrode and the drain electrode and separated from the CNT;
a charge storage layer which is formed on the CNT and the first insulating layer, which stores charges; and
a second insulating layer formed on the charge storage layer,
wherein the first insulating layer, the charge storage layer, and the second insulating layer comprises a memory cell, and
wherein the charge storage layer comprises a molecular adsorption layer of molecules having an energy level within an energy band gap of the CNT.

17. The memory device of claim 16, wherein the molecular layer is one selected from the group consisting of oxygen, bromine, iodine, and TTF (tetrathiafulvalene).

18. The memory device of claim 16, wherein the molecular adsorption layer comprises a base layer selected from the group consisting of amorphous carbon, CNT, boron nitride, and zeolite and the molecular layer is adsorbed on the base layer.

19. A memory device comprising:
a substrate;
a first insulating layer formed on the substrate;
a source electrode and a drain electrode formed on the first insulating layer and separated from each other;
a CNT electrically connected to the source electrode and the drain electrode;
a gate electrode formed on the first insulating layer between the source electrode and the drain electrode and separated from the CNT;
a charge storage layer which is formed on the CNT and the first insulating layer, which stores charges; and
a second insulating layer formed on the charge storage layer,
wherein the first insulating layer, the charge storage layer, and the second insulating layer comprises a memory cell, and
wherein the CNT has a surface doped with alkali metal.

* * * * *